United States Patent
Ishii

(10) Patent No.: US 10,547,302 B2
(45) Date of Patent: Jan. 28, 2020

(54) INTERNAL COMBUSTION ENGINE IGNITER

(71) Applicant: Fuji Electric Co., Ltd., Kanagawa (JP)

(72) Inventor: Kenichi Ishii, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 317 days.

(21) Appl. No.: 15/696,785

(22) Filed: Sep. 6, 2017

(65) Prior Publication Data

US 2018/0097514 A1 Apr. 5, 2018

(30) Foreign Application Priority Data

Oct. 5, 2016 (JP) ................. 2016-197615

(51) Int. Cl.
| | |
|---|---|
| *H03K 17/082* | (2006.01) |
| *F02P 11/00* | (2006.01) |
| *H01F 38/12* | (2006.01) |
| *H02H 7/20* | (2006.01) |

(52) U.S. Cl.
CPC .......... *H03K 17/0828* (2013.01); *F02P 11/00* (2013.01); *H01F 38/12* (2013.01); *H02H 7/20* (2013.01)

(58) Field of Classification Search
CPC ...... H03K 17/0828; F02P 11/00; H01F 38/12; H02H 7/20
See application file for complete search history.

(56) References Cited

U.S. PATENT DOCUMENTS

| | | | | |
|---|---|---|---|---|
| 8,006,678 | B2* | 8/2011 | Naito | F02P 3/0552 123/143 R |
| 2002/0060913 | A1* | 5/2002 | Yasuda | H02M 1/00 363/19 |
| 2004/0000299 | A1* | 1/2004 | Naruse | F02P 3/0428 123/644 |
| 2004/0200463 | A1* | 10/2004 | Ando | F02P 3/0435 123/630 |
| 2012/0215431 | A1* | 8/2012 | Miyazawa | F02P 3/0552 701/115 |
| 2015/0116890 | A1* | 4/2015 | Naruse | F02P 1/083 361/254 |

FOREIGN PATENT DOCUMENTS

JP 3320257 B2 9/2002

* cited by examiner

*Primary Examiner* — Scott Bauer
(74) *Attorney, Agent, or Firm* — Chen Yoshimura LLP

(57) ABSTRACT

An internal combustion engine igniter of the present invention includes a current limiting circuit that limits current flowing to the IGBT by controlling a gate voltage of the IGBT in accordance with the current flowing to the IGBT, a waveform-shaping circuit that suppresses an oscillation of the current flowing to the IGBT by applying to the gate voltage of the IGBT an auxiliary voltage generated from a collector voltage of the IGBT when current is being limited by the current limiting circuit, and, in addition, a heat-generation suppressing circuit that obtains an intermediate voltage by resistively dividing the auxiliary voltage generated by the waveform-shaping circuit when current is being limited by the current limiting circuit, and that suppresses IGBT heat generation by increasing the current flowing to the IGBT in accordance with the intermediate voltage.

6 Claims, 4 Drawing Sheets

With Current Limiting Operation

Without Current Limiting Operation

US 10,547,302 B2

INTERNAL COMBUSTION ENGINE IGNITER

BACKGROUND OF THE INVENTION

Technical Field

The present invention relates to an internal combustion engine igniter of a simple configuration that is capable of preventing performance deterioration of an ignition coil resulting from prolonged abnormal operation of a power semiconductor device, e.g., an insulated-gate bipolar transistor (IGBT), that controls current flowing to the ignition coil.

Background Art

As shown in FIG. 3, for example, an internal combustion engine igniter 1 for controlling the ignition of the internal combustion engine includes a power semiconductor device 4 that controls current flowing to an ignition coil 3 in accordance with a control signal provided from an engine control unit (ECU) 2. An insulated-gate bipolar transistor (IGBT) is primarily used as this power semiconductor device 4. The IGBT 4 is disposed by being connected in series to a primary coil of the ignition coil 3, and plays the role of inducing a high voltage in a secondary coil of the ignition coil 3 by turning ON/OFF the current that flows to the primary coil.

This type of igniter 1, as shown in FIG. 3, also includes a shunt resistor RS that is connected in series to an emitter of the IGBT 4. This shunt resistor RS detects from one end to the other thereof, as a current-detection voltage value $V_{is}$, a voltage corresponding to current flowing to the IGBT 4. A current limiting circuit 5 for controlling the current flowing to the IGBT 4 includes an operational amplifier 5b that controls a gate voltage $V_{ge}$ of the IGBT 4 so that a voltage difference between the current-detection voltage value $V_{is}$ detected by the shunt resistor RS and a voltage threshold $V_{ref}$ set by a constant voltage source 5a is 0 (zero). Specifically, the operational amplifier 5b controls the gate voltage of an n-type MOSFET 6 that is connected between a gate of the IGBT 4 and a ground terminal, and controls the gate voltage $V_{ge}$ of the IGBT 4 by controlling a source-drain voltage of the MOSFET 6. A current $I_c$ flowing to the IGBT 4 is kept constant by controlling the gate voltage $V_{ge}$ of the IGBT 4 using this current limiting circuit 5.

The igniter 1 also includes an overheat detection circuit 7. When the temperature of the IGBT 4 exceeds a prescribed temperature, this overheat detection circuit 7 sets the gate voltage $V_{ge}$ of the IGBT 4 to ground potential (0V) by turning ON a MOSFET 8, for example. In so doing, the IGBT 4 is forcibly turned OFF by the ON operation of the MOSFET 8, thereby cutting off the current $I_c$ flowing to the IGBT 4. By cutting off the current $I_c$ flowing to the IGBT 4, abnormal heat generation (overheating) in the IGBT 4 is prevented. Furthermore, $R_{in}$ in FIG. 3 is an input resistor to which is applied a control signal provided from the engine control unit (ECU) 2, and ZD is a Zener diode that clamps the control signal at a fixed voltage and applies this control signal to the gate of the IGBT 4.

The igniter 1 that includes the current limiting circuit 5 and overheat detection circuit 7 and that prevents overheating of the IGBT 4 is introduced in detail in Patent Document 1, for example.

However, the igniter 1 shown in FIG. 3 further includes a waveform-shaping circuit 9 in addition to the above-mentioned current limiting circuit 5 and overheat detection circuit 7. This waveform-shaping circuit 9 generates an auxiliary voltage V1 from a collector-emitter voltage (hereinafter referred to as collector voltage) $V_{ce}$ of the IGBT 4 that rises suddenly at the start of a current-limiting operation by the current limiting circuit 5. By applying the auxiliary voltage V1 to the gate voltage of the IGBT, the waveform-shaping circuit 9 also plays the role of suppressing an oscillation (voltage oscillation) of the collector voltage $V_{ce}$ of the IGBT 4 caused by a phase delay in the current $I_c$ flowing to the IGBT 4.

Specifically, the waveform-shaping circuit 9 includes an IGBT 9a in which the collector thereof connects to the collector of the IGBT 4, and the emitter and gate thereof are grounded in the opposite direction via a diode D. Moreover, the waveform-shaping circuit 9 is configured so as to apply to the gate of the IGBT 4 via a resistor R1 the auxiliary voltage V1 arising in the emitter of the IGBT 9a in accordance with the collector voltage $V_{ce}$ of the IGBT 4.

The waveform-shaping circuit 9, by applying the auxiliary voltage V1 to the gate voltage of the IGBT 4, increases the current $I_c$ flowing to the IGBT 4 in accordance with the sudden rise in the collector voltage $V_{ce}$ of the IGBT 4. As a result of this, the sudden rise in the collector voltage $V_{ce}$ of the IGBT 4 at the start of a current-limiting operation is suppressed. In other words, the waveform-shaping circuit 9 suppresses the oscillation of the collector voltage $V_{ce}$ of the IGBT 4 caused by the phase delay in the current $I_c$ flowing to the IGBT 4 at the start of the current-limiting operation by the current limiting circuit 5.

RELATED ART DOCUMENT

Patent Document

Patent Document 1: Japanese Patent No. 3320257

SUMMARY OF THE INVENTION

However, the IGBT 4 is required to have switching characteristics and a collector-emitter withstand voltage that satisfy various characteristics (operating specifications) during normal operation of the igniter 1. Further, when the IGBT 4 generates heat abnormally, for example, the igniter 1 either forcibly cuts off or reduces the current $I_c$ flowing to the IGBT 4 using the overheat detection circuit 7. Also, the igniter 1 is configured such that a malfunction of the ignition coil 3, such as an abnormal ignition, is also prevented. Hence, in addition to the above-mentioned characteristics, the IGBT 4 is further required to have a high robustness capable of withstanding a steep surge voltage or a reverse voltage between the collector and the emitter at the time of an abnormality. However, an IGBT 4 that satisfies all of these requirements would need to have a large device area and would be expensive.

Meanwhile, the current limiting circuit 5 and overheat detection circuit 7, which limit the current $I_c$ flowing to the IGBT 4, are effective as protective functions against a short-lasting, momentary abnormality of around several milliseconds. However, when the above-mentioned current limiting controls are implemented during the occurrence of a prolonged abnormality lasting for 10 milliseconds or longer, for example, the collector voltage $V_{ce}$ of the IGBT 4 increases as a result of this.

FIG. 4A shows changes in the collector voltage $V_{ce}$, a collector current $I_c$, and a power loss W in relation to the gate voltage $V_{ge}$ that turns the IGBT 4 ON/OFF when current limiting is performed. FIG. 4B shows, in comparison to FIG. 4A, changes in the collector voltage $V_{ce}$, the collector current $I_c$, and the power loss W of the IGBT 4 when current limiting is not performed. As shown in FIGS. 4A and 4B, the collector voltage $V_{ce}$ of the IGBT 4 when current limiting is performed is higher than the collector voltage $V_{ce}$ when current limiting is not performed, and the power loss W in the IGBT 4 associated with heat generation is also greater.

Thus, when prolonged conducting of the IGBT 4 occurs under the parameters of a current-limiting operation, for example, heat generation is several to dozens of times the amount of heat generated in the IGBT 4 during normal operations when current limiting is not performed. Thus, an increase in temperature caused by excessive amounts of heat being generated in the IGBT 4, for example, runs the risk of leading to the deterioration and destruction of the igniter 1. To cope with the large amounts of generated heat like this, the device area of the IGBT 4 must be sufficiently enlarged, resulting in a large and costly igniter 1.

In consideration of the situation described above, the present invention aims at providing an internal combustion engine igniter of a simple configuration that is capable of suppressing unintended IGBT heat generation when the IGBT operates abnormally for a prolonged period of time, and of preventing a deterioration in performance of the IGBT and/or the ignition coil and so forth resulting from an increase in temperature caused by heat generation. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides an igniter for an internal combustion system, including: a power semiconductor device configured to be connected to an ignition coil of the internal combustion engine so as to control current flowing to the ignition coil in accordance with a control voltage applied to a control electrode of the power semiconductor device; a gate terminal that is configured to receive a control signal from an engine control unit, the gate terminal being connected to the control electrode of the power semiconductor device so that the control signal constitutes at least a portion of the control voltage; a current limiting circuit that limits current flowing to the power semiconductor device by controlling the control voltage applied to the control electrode of the power semiconductor device in accordance with the current flowing to the power semiconductor device; and a waveform-shaping circuit that suppresses an oscillation of the current flowing to the power semiconductor device by adding to the control electrode of the power semiconductor device an auxiliary voltage generated from a voltage across main electrodes of the power semiconductor device when the current is being limited by the current limiting circuit.

In particular, the internal combustion engine igniter according to the present invention, to achieve the above-mentioned aims, includes a heat-generation suppressing circuit that obtains an intermediate voltage by resistively dividing the auxiliary voltage when the current is being limited by the current limiting circuit and that causes heat generation of the power semiconductor device to be suppressed in accordance with the intermediate voltage.

The current limiting circuit may include an amplifier that controls a gate voltage of the IGBT so that a voltage difference between a current-detection voltage value arising in a shunt resistor that is connected in series to an emitter of the IGBT and a prescribed voltage threshold, for example, is 0 (zero). Further, the heat-generation suppressing circuit may cause a voltage threshold of the current limiting circuit to be increased in accordance with the intermediate voltage when the current is being limited by the current limiting circuit. Alternatively, the heat-generation suppressing circuit may be configured so as to superimpose the intermediate voltage on the control voltage applied to the control electrode of the power semiconductor device when the current is being limited by the current limiting circuit, for example.

In addition, the internal combustion engine igniter according to the present invention may further include an overheat detection circuit that detects a temperature of the power semiconductor device, the overheat detection circuit causing the control voltage applied to the power semiconductor device to be reduced so as to suppress the temperature of the power semiconductor device when the detected temperature of the power semiconductor device reaches a first overheat protection temperature threshold.

The overheat detection circuit may have a second overheat protection temperature threshold that is set lower than the first overheat protection temperature threshold, and when the detected temperature of the power semiconductor device exceeds the second overheat protection temperature threshold while the current is being limited by the current limiting circuit, the overheat detection circuit causes a threshold voltage of the current limiting circuit to be increased so as to increase the current flowing to the power semiconductor device, for example.

The igniter according to the present invention includes the heat-generation suppressing circuit that suppresses IGBT heat generation by increasing the current flowing to the IGBT in accordance with the intermediate voltage obtained by resistively dividing the auxiliary voltage. Then, when the IGBT operates abnormally for a prolonged period of time, the current flowing to the IGBT is increased by the heat-generation suppressing circuit even during current limiting by the current limiting circuit. As a result of this, it is possible to suppress the heat generation of the IGBT during current limiting, and to prevent the deterioration of ignition coil performance associated with the heat generation of the IGBT.

In particular, the heat-generation suppressing circuit only increases the current flowing to the IGBT by either increasing the voltage threshold of the current limiting circuit in accordance with the intermediate voltage, or increasing the gate voltage of the IGBT. Therefore, it is possible to use a simple configuration to effectively suppress the heat generation of the IGBT when an abnormal operation of the IGBT lasts for a prolonged period of time.

Further, when an overheat detection circuit is provided for suppressing the heat-generation temperature of the IGBT in accordance with the temperature of the IGBT, the gate voltage of the IGBT simply needs to be increased when the temperature of the IGBT exceeds the second overheat protection temperature threshold that is set lower than the overheat protection temperature threshold during normal operation. Therefore, it is possible to reduce the current flowing to the IGBT and to suppress the heat generation thereof not only when the temperature of the IGBT has momentarily exceeded the overheat protection temperature threshold, but also when the temperature of the IGBT has exceeded the second overheat protection temperature threshold. Therefore, it is possible to effectively prevent unintended overheating of the IGBT even when an abnormal operation of the IGBT occurs over a prolonged period of time.

It is to be understood that both the foregoing general description and the following detailed description are exemplary and explanatory, and are intended to provide further explanation of the invention as claimed.

DETAILED DESCRIPTION OF THE EMBODIMENTS

The igniter according to the embodiments of the present invention will be explained below with reference to figures.

Figure 1:
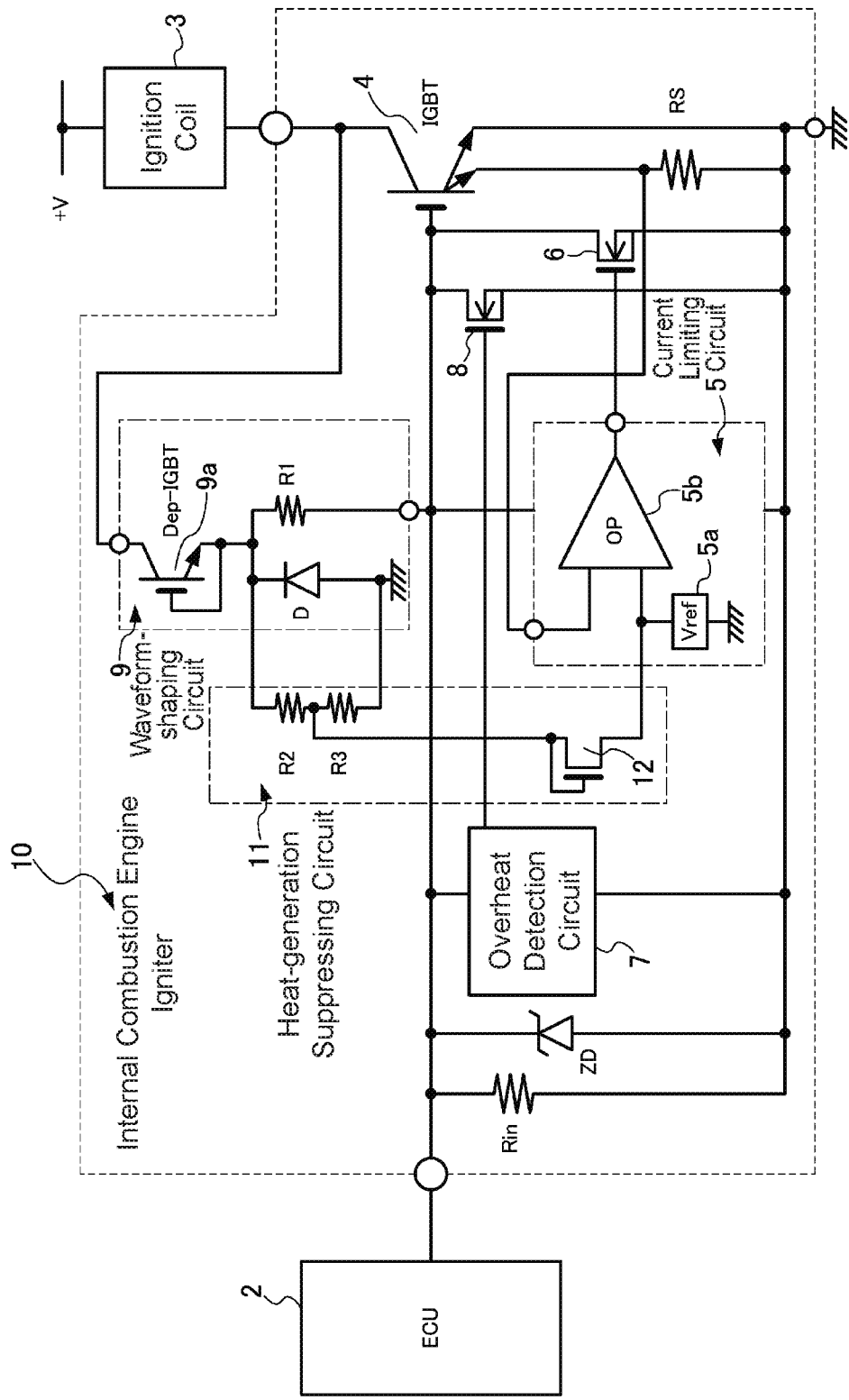
FIG. 1 is a schematic diagram showing the overall configuration of an igniter according to an embodiment of the present invention.
Figure 3:
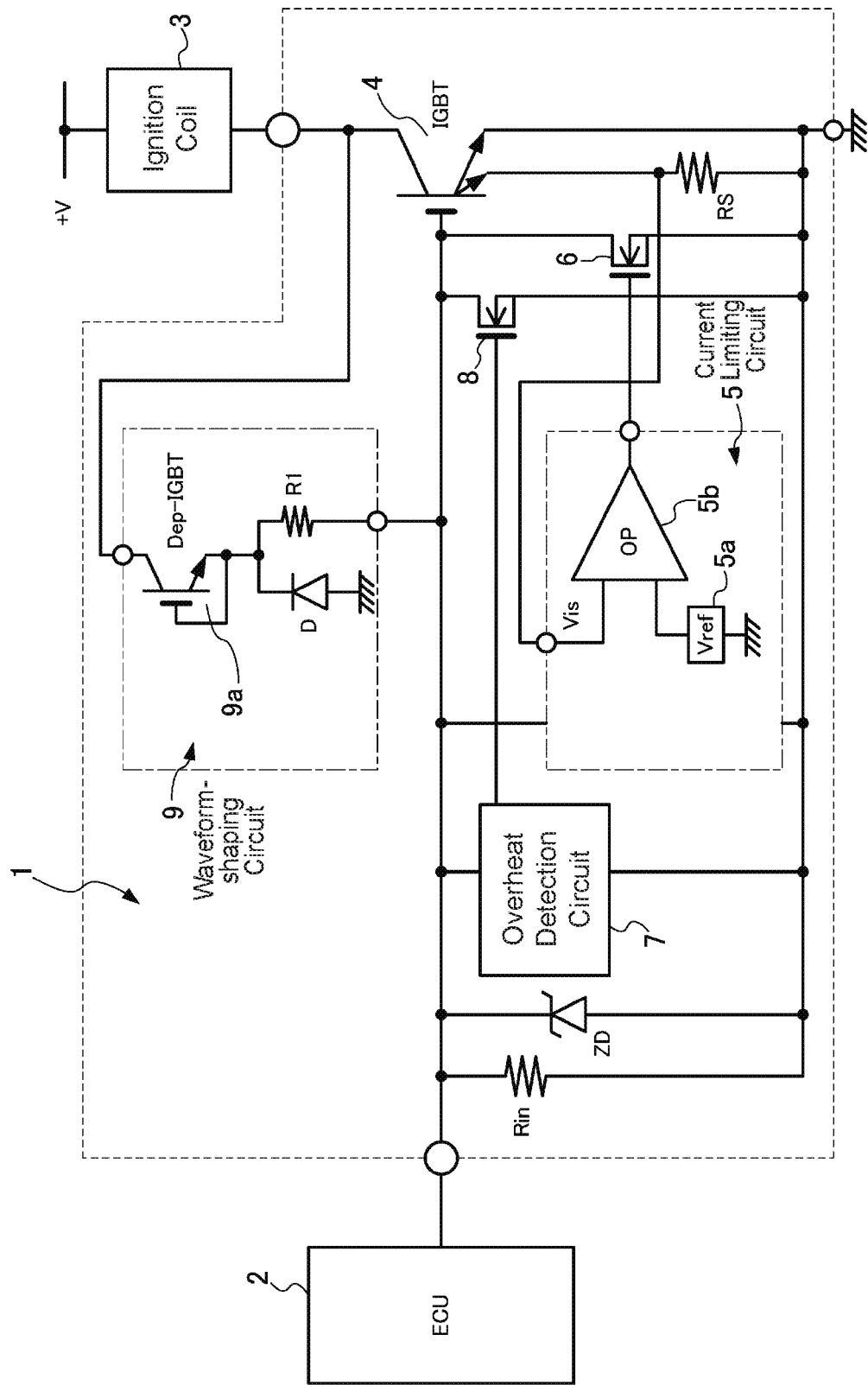
FIG. 3 is a schematic diagram showing an example of the overall configuration of a conventional igniter.
Figure 4A:
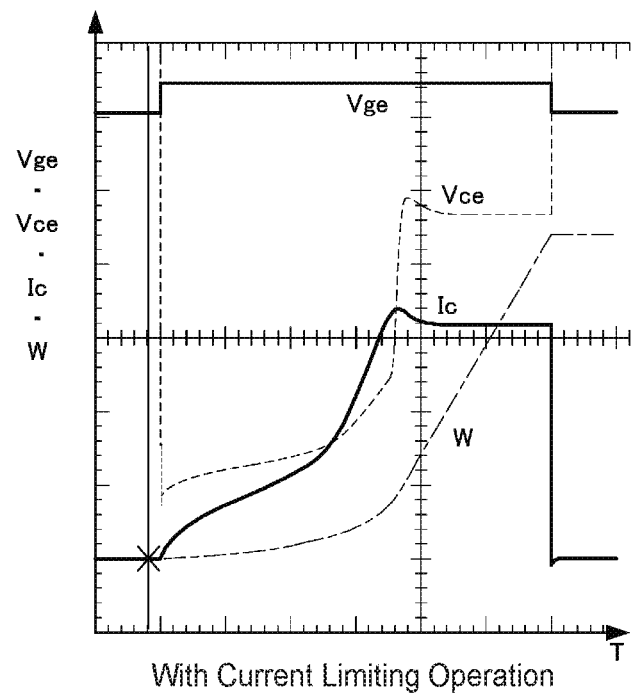
FIGS. 4A and 4B are diagrams comparing the operational characteristics of an IGBT when current is being limited to the operational characteristics of the IGBT when current is not being limited.
Figure 4B:
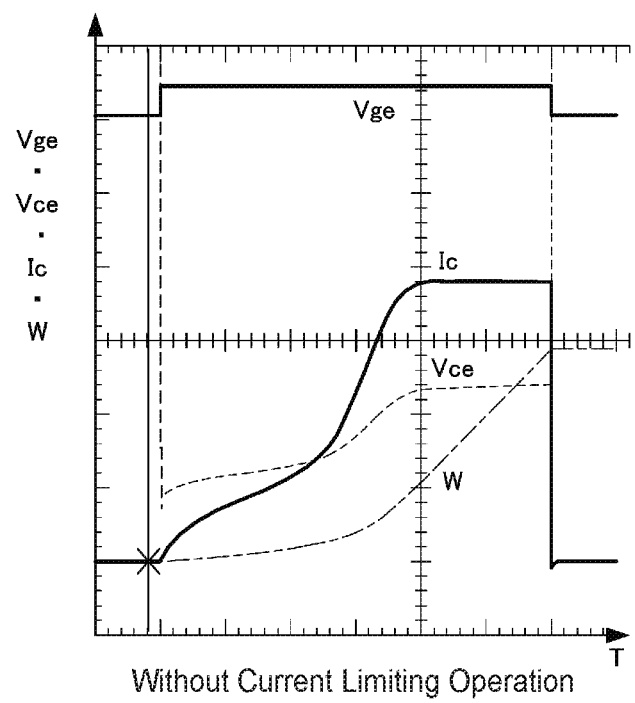

FIG. 1 is a diagram showing the overall configuration of an igniter 10 according to an embodiment of the present invention, and the same reference characters are given to the same portions as those in the conventional igniter 1 shown in FIG. 3. Furthermore, detailed explanations of the same portions as those in the conventional igniter 1 will be omitted.

In addition to the configuration of the conventional igniter 1, the igniter 10 according to this embodiment includes a heat-generation suppressing circuit 11 for coping with the occurrence of abnormalities that last for a relatively long time, such as 10 milliseconds or longer, for example. This heat-generation suppressing circuit 11 plays the role of suppressing IGBT heat generation by increasing the current flowing to an IGBT 4 in a state (during a current limiting operation) in which the current flowing to the IGBT 4 is being limited by a current limiting circuit 5.

Specifically, the heat-generation suppressing circuit 11 includes resistors R2 and R3 for obtaining an intermediate voltage V2 by resistively dividing an auxiliary voltage V1, which specifically is an emitter voltage of an IGBT 9a, generated by a waveform-shaping circuit 9 in accordance with a collector voltage $V_{ce}$ of the IGBT 4. In addition, the heat-generation suppressing circuit 11 includes a MOSFET switch 12 that increases a voltage threshold $V_{ref}$ set by a constant voltage source 5a in accordance with the intermediate voltage V2 obtained via the resistors R2 and R3. This MOSFET switch 12 plays the role of raising the voltage threshold $V_{ref}$ provided to an operational amplifier 5b by connecting the gate and the source of the MOSFET and performing a diode operation, and by adding the intermediate voltage V2 to a constant voltage generated and outputted by the constant voltage source 5a.

In this way, the heat-generation suppressing circuit 11 increases the gate voltage $V_{ge}$ of the IGBT 4 during a current limiting operation by raising the voltage threshold $V_{ref}$ of the current limiting circuit 5, thereby increasing the current $I_c$ flowing to the IGBT 4. Thus, the collector voltage $V_{ce}$ of the IGBT 4 is reduced in association with the increase in the current $I_c$ flowing to the IGBT 4. Incidentally, the amount of heat generated by the IGBT 4 depends more heavily on this collector voltage $V_{ce}$ than on the current $I_c$ flowing to the IGBT 4.

Therefore, when current is being limited by the current limiting circuit 5, the collector voltage $V_{ce}$ of the IGBT 4 can be reduced by increasing the current $I_c$ flowing to the IGBT 4 in accordance with the collector voltage $V_{ce}$ of the IGBT 4. As a result of this, since the collector voltage $V_{ce}$ of the IGBT 4 can be kept low when an abnormal ON operation of the IGBT 4 lasts for a prolonged period of time, it becomes possible to effectively suppress the amount of heat generated by the IGBT 4.

Further, the heat-generation suppressing circuit 11 only operates when the collector voltage $V_{ce}$ is higher than the gate voltage $V_{ge}$ of the IGBT 4 and the waveform-shaping circuit 9 generates an auxiliary voltage V1 as a result of this. In other words, the heat-generation suppressing circuit 11 functions effectively only when the current limiting circuit 5 is limiting the current $I_c$ flowing to the IGBT when an abnormality occurs. Therefore, the existence of the heat-generation suppressing circuit 11 does not in any way adversely affect normal operations in which the IGBT 4 is being driven to ON/OFF in accordance with control signals.

Moreover, the heat-generation suppressing circuit 11 is an extremely simple configuration as described above, and by comparison to the conventional igniter 1, the configuration of the igniter 10 does not evoke pointless complexity and up sizing. What is more, the heat-generation suppressing circuit 11 can greatly relax the specifications required in the IGBT 4, including those for prolonged abnormal operations. Therefore, the present invention makes it possible to use an appropriate size IGBT 4 having breakdown characteristics capable of coping with normal operations and momentary abnormal operations. As a result of this, it becomes possible to inexpensively realize a simple-configuration igniter 10.

Figure 2:
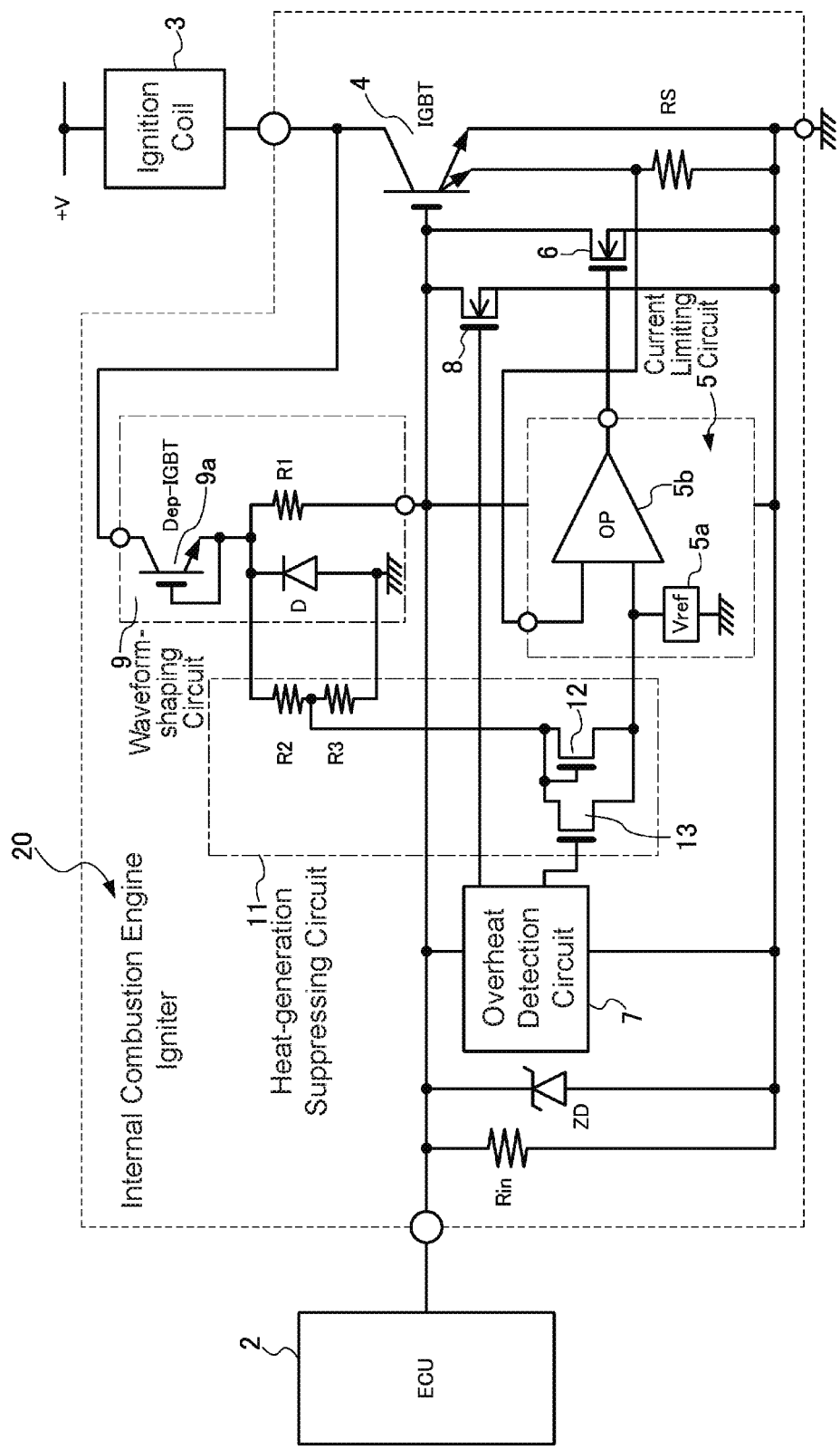
FIG. 2 is a schematic diagram showing the overall configuration of an igniter according to another embodiment of the present invention.

FIG. 2 is a schematic diagram of an igniter 20 according to another embodiment of the present invention. Here, the same reference characters are given to the same portions as those in the conventional igniter 1 shown in FIG. 3 and the igniter 10 shown in FIG. 1.

This igniter 20 includes a MOSFET 13 in parallel with the MOSFET switch 12 in the heat-generation suppressing circuit 11. This MOSFET 13 is turned ON by temperature information obtained from the overheat detection circuit 7, specifically, when the temperature of the IGBT 4 has reached a temperature threshold that is set lower than the temperature threshold at which the overheat detection circuit 7 turns ON the MOSFET 8.

This MOSFET 13, during an ON operation thereof, plays the role of adding the intermediate voltage V2 to the constant voltage generated by the constant voltage source 5a in the current limiting circuit 5. According to the ON operation of this MOSFET 13, the intermediate voltage V2 is added to the voltage threshold $V_{ref}$ provided to the operational amplifier 5b, and the gate voltage $V_{ge}$ of the IGBT 4 is increased. As a result of this, the current $I_c$ flowing to the IGBT 4 can be increased by increasing the gate voltage $V_{ge}$ of the IGBT 4 in a state in which the current $I_c$ flowing to the IGBT 4 is being limited by the current limiting circuit 5. Therefore, it is possible to increase the current $I_c$ flowing to the IGBT 4 while the current $I_c$ flowing to the IGBT 4 is being limited, and it is possible to suppress abnormal heat generation in the IGBT 4 by suppressing a rise in the collector voltage $V_{ce}$ of the IGBT 4.

Therefore, according to the igniter 20 shown in FIG. 2, it is possible to suppress abnormal heat generation in the IGBT 4 on the basis of temperature information obtained from the overheat detection circuit 7 even when an abnormal state thereof lasts for a prolonged period of time in a state in which current flowing to the IGBT 4 is being limited by the current limiting circuit 5. That is, prior to the temperature of the IGBT 4 reaching the temperature threshold of the overheat detection circuit 7 at which the IGBT 4 is forcibly turned OFF, the current $I_c$ flowing to the IGBT 4 can be limited in accordance with the temperature of the IGBT 4 obtained by the overheat detection circuit 7. As a result of this, it is possible to suppress an unintended increase in the collector voltage $V_{ce}$ of the IGBT 4 during a current limiting operation.

Namely, the igniter 20 makes it is possible to use the heat-generation suppressing circuit 11 to suppress the current $I_c$ flowing to the IGBT 4 prior to the temperature of the IGBT 4 in a state of normal operation reaching the temperature threshold at which the overheat detection circuit 7 operates. In particular, it is possible to suppress, on the basis of the intermediate voltage V2, the current $I_c$ flowing to the IGBT 4 from the time that the temperature of the IGBT 4 in a state of normal operation reaches the second temperature threshold that is set lower than the prescribed temperature threshold. Therefore, it is possible to prevent a rise in the temperature of the IGBT 4 prior to an unintended rise in the collector voltage $V_{ce}$ of the IGBT 4 occurring when an overcurrent is detected. As a result of this, it becomes possible to effectively prevent a deterioration in the performance and/or the destruction of the ignition coil 3 and so forth associated with the heat generation in the IGBT 4 even when an unintended ON operation of the IGBT 4 lasts for a prolonged period of time. Therefore, similar effects to the above-described embodiment are achieved.

Furthermore, the present invention is not limited to the above-mentioned embodiments. For example, when the current $I_c$ flowing to the IGBT 4 is reduced by the heat-generation suppressing circuit 11, it is also possible to add the above-mentioned intermediate voltage V2 directly to the gate voltage of the IGBT 4. Further, the overheat detection circuit 7 includes a plurality of diodes that are generally connected in series, for example, and are configured so as to output from the cathodes of these diodes (proportional) temperature information that corresponds to the temperature of the IGBT 4.

Therefore, it is sufficient that the heat-generation suppressing circuit 11 be configured so as to control the operation of the MOSFET 13 using information of a plurality of temperatures obtained in the overheat detection circuit 7 as the temperature information of the IGBT 4. For example, if the overheat detection circuit 7 is set to operate when the temperature of the IGBT 4 exceeds 200° C., it is sufficient that the heat-generation suppressing circuit 11 be configured so as to operate when the temperature of the IGBT 4 exceeds 170° C. Further, the present invention is applicable even in cases where a power MOSFET, for example, is used as the power semiconductor device. In addition, various modifications can be made without departing from the spirit of the present invention.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. An igniter for an internal combustion engine, comprising:
   a power semiconductor device configured to be connected to an ignition coil of the internal combustion engine so as to control current flowing to the ignition coil in accordance with a control voltage applied to a control electrode of the power semiconductor device;
   a gate terminal that is configured to receive a control signal from an engine control unit, the gate terminal being connected to the control electrode of the power semiconductor device so that the control signal constitutes at least a portion of the control voltage;
   a current limiting circuit that limits current flowing to the power semiconductor device by controlling the control voltage applied to the control electrode of the power semiconductor device in accordance with the current flowing to the power semiconductor device;
   a waveform-shaping circuit that suppresses an oscillation of the current flowing to the power semiconductor device by adding to the control electrode of the power semiconductor device an auxiliary voltage generated from a voltage across main electrodes of the power semiconductor device when the current is being limited by the current limiting circuit; and
   a heat-generation suppressing circuit that obtains an intermediate voltage by resistively dividing the auxiliary voltage when the current is being limited by the current limiting circuit and that causes heat generation of the power semiconductor device to be suppressed in accordance with the intermediate voltage.

2. The igniter for the internal combustion engine according to claim 1, wherein the power semiconductor device is an IGBT in which the main electrodes are a collector and an emitter, and the control electrode is a gate.

3. The igniter for the internal combustion engine according to claim 1, wherein the heat-generation suppressing circuit causes a voltage threshold of the current limiting circuit to be increased in accordance with the intermediate voltage when the current is being limited by the current limiting circuit.

4. The igniter for the internal combustion engine according to claim 1, wherein the heat-generation suppressing circuit is configured so as to superimpose the intermediate voltage on the control voltage applied to the control electrode of the power semiconductor device when the current is being limited by the current limiting circuit.

5. The igniter for the internal combustion engine according to claim 1, further comprising an overheat detection circuit that detects a temperature of the power semiconductor device, the overheat detection circuit causing the control voltage applied to the power semiconductor device to be reduced so as to suppress the temperature of the power semiconductor device when the detected temperature of the power semiconductor device reaches a first overheat protection temperature threshold.

6. The igniter for the internal combustion engine according to claim 5, wherein the overheat detection circuit has a second overheat protection temperature threshold that is set lower than the first overheat protection temperature threshold, and when the detected temperature of the power semiconductor device exceeds the second overheat protection temperature threshold while the current is being limited by the current limiting circuit, the overheat detection circuit causes a threshold voltage of the current limiting circuit to be increased so as to increase the current flowing to the power semiconductor device.

* * * * *